(12) United States Patent
Krams et al.

(10) Patent No.: US 9,892,640 B2
(45) Date of Patent: Feb. 13, 2018

(54) HIGH-VOLTAGE APPARATUS AND EXTERNAL REPRODUCTION APPARATUS AND SYSTEM

(71) Applicant: Bayerische Motoren Werke Aktiengesellschaft, Munich (DE)

(72) Inventors: Peter Krams, Neuried (DE); Andreas Boehland, Oberschleissheim (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 2 days.

(21) Appl. No.: 15/042,517

(22) Filed: Feb. 12, 2016

(65) Prior Publication Data

US 2016/0163192 A1 Jun. 9, 2016

Related U.S. Application Data

(63) Continuation of application No. PCT/EP2014/066488, filed on Jul. 31, 2014.

(30) Foreign Application Priority Data

Aug. 14, 2013 (DE) .......................... 10 2013 216 129

(51) Int. Cl.
*G08G 1/00* (2006.01)
*G08G 1/07* (2006.01)
(Continued)

(52) U.S. Cl.
CPC .................. *G08G 1/07* (2013.01); *B60L 3/00* (2013.01); *B60L 3/0007* (2013.01); *B60L 11/14* (2013.01);
(Continued)

(58) Field of Classification Search
CPC ... Y02E 60/12; Y02E 60/3682; B60L 3/0023; G01R 31/006; G01R 31/3679
(Continued)

(56) References Cited

U.S. PATENT DOCUMENTS 8,738,310 B2 * 5/2014 Swanton ............ G01R 31/3679
324/600
2006/0250233 A1 * 11/2006 Powell ............... G01R 31/3606
340/539.1
(Continued)

FOREIGN PATENT DOCUMENTS

CN 2898851 Y 5/2007
CN 102854372 A 1/2013
(Continued)

OTHER PUBLICATIONS

Chinese-language Office Action issued in counterpart Chinese Application No. 201480043323.7 dated Jan. 4, 2017 with English translation (Sixteen (16) pages).
(Continued)

*Primary Examiner* — Munear Akki
(74) *Attorney, Agent, or Firm* — Crowell & Moring LLP

(57) ABSTRACT

A high-voltage apparatus has at least one high-voltage component and at least one current sensor, which is assigned to a corresponding high-voltage component. The high-voltage apparatus has at least one transmission apparatus, to which at least one corresponding current sensor is assigned. The at least one transmission apparatus is designed to provide an information signal, which contains information on whether there is a potential risk originating from the corresponding high-voltage component or not, depending on a measurement signal of the at least one corresponding current sensor, by way of a wireless radio link in order for the information to be reproduced on an external reproduction apparatus.

7 Claims, 2 Drawing Sheets

(51) Int. Cl.
*B60L 3/00* (2006.01)
*B60L 11/14* (2006.01)
*B60L 11/18* (2006.01)
*G01R 19/25* (2006.01)
*G01R 31/00* (2006.01)

(52) U.S. Cl.
CPC .......... *B60L 11/1805* (2013.01); *G01R 19/25* (2013.01); *G01R 31/006* (2013.01); *B60L 2240/429* (2013.01); *B60L 2240/529* (2013.01); *B60L 2240/549* (2013.01); *B60L 2240/70* (2013.01); *B60L 2250/10* (2013.01); *B60L 2250/16* (2013.01); *B60L 2260/22* (2013.01); *Y02T 10/642* (2013.01); *Y02T 10/70* (2013.01); *Y02T 10/7005* (2013.01); *Y02T 10/7077* (2013.01); *Y02T 10/7291* (2013.01); *Y02T 90/16* (2013.01)

(58) Field of Classification Search
USPC ...... 340/636.1, 636.12, 636.17, 636.19, 428; 324/503
See application file for complete search history.

(56) References Cited

U.S. PATENT DOCUMENTS

| | | | |
|---|---|---|---|
| 2008/0309317 A1 | 12/2008 | Chen et al. | |
| 2010/0182157 A1* | 7/2010 | Shaffer | H04Q 9/00 340/636.13 |
| 2010/0214094 A1 | 8/2010 | Givens et al. | |
| 2010/0265051 A1* | 10/2010 | Sivertsen | B60L 3/0023 340/438 |
| 2012/0050067 A1* | 3/2012 | Otterson | G08G 1/205 340/902 |
| 2013/0175881 A1 | 7/2013 | Shuey | |
| 2013/0179061 A1* | 7/2013 | Gadh | B60L 11/1842 701/123 |
| 2013/0262002 A1* | 10/2013 | Braun | H04Q 9/00 702/63 |
| 2014/0022083 A1* | 1/2014 | Wells | G01R 31/041 340/635 |
| 2014/0203077 A1* | 7/2014 | Gadh | H02J 7/00 235/382 |
| 2014/0266062 A1* | 9/2014 | Lee | H01M 10/44 320/134 |
| 2014/0340074 A1* | 11/2014 | Nurnus | G01R 15/142 324/105 |
| 2015/0338470 A1* | 11/2015 | Zumstein | H01M 10/486 324/426 |
| 2016/0036098 A1* | 2/2016 | Washiro | H02J 7/0021 429/50 |
| 2016/0043583 A1* | 2/2016 | Yoshida | H02J 7/0026 320/112 |

FOREIGN PATENT DOCUMENTS

| | | |
|---|---|---|
| DE | 10 2009 027 177 A1 | 12/2010 |
| DE | 10 2010 050 976 A1 | 5/2012 |
| DE | 10 2011 003 308 A1 | 8/2012 |
| DE | 10 2011 109 707 A1 | 2/2013 |
| DE | 10 2011 083 600 A1 | 3/2013 |
| DE | 10 2012 102 664 A1 | 10/2013 |
| EP | 2 278 344 A2 | 1/2011 |
| WO | WO 02/10775 A2 | 2/2002 |
| WO | WO 2012/054279 A2 | 4/2012 |

OTHER PUBLICATIONS

International Search Report (PCT/ISA/210) issued in PCT Application No. PCT/EP2014/066488 dated Feb. 20, 2015, with English translation (six (6) pages).

German Search Report issued in counterpart German Application No. 10 2013 216 129.8 dated Feb. 21, 2014, with partial English translation (ten (10) pages).

* cited by examiner

HIGH-VOLTAGE APPARATUS AND EXTERNAL REPRODUCTION APPARATUS AND SYSTEM

CROSS REFERENCE TO RELATED APPLICATIONS

This application is a continuation of PCT International Application No. PCT/EP2014/066488, filed Jul. 31, 2014, which claims priority under 35 U.S.C. § 119 from German Patent Application No. 10 2013 216 129.8, filed Aug. 14, 2013, the entire disclosures of which are herein expressly incorporated by reference.

BACKGROUND AND SUMMARY OF THE INVENTION

The invention relates to a high-voltage apparatus. Furthermore, the invention relates to a corresponding external reproduction apparatus. Furthermore, the invention relates to a corresponding system having the high-voltage apparatus and the external reproduction apparatus.

If an accident occurs in or with a high-voltage apparatus, it is often impossible for people outside the high-voltage apparatus to tell whether the high-voltage apparatus is live and whether a threat is therefore posed by the high-voltage apparatus.

The object on which the invention is based is that of providing a high-voltage apparatus and an external reproduction apparatus that helps to make it possible to ascertain without touching whether a threat is posed by the high-voltage apparatus.

This and other objects are achieved by a high-voltage apparatus having at least one high-voltage component, at least one current sensor that is associated with a respective high-voltage component, and at least one transmission apparatus that has at least one respective associated current sensor, wherein the at least one transmission apparatus is designed to take a measurement signal from the at least one respective current sensor as a basis for providing an information signal via a wireless radio link, which information signal has a piece of information about whether or not a potential threat is posed by the respective high-voltage component, for the purpose of reproducing the piece of information on an external reproduction apparatus.

The invention is distinguished by a high-voltage apparatus. The invention is furthermore distinguished by a corresponding external reproduction apparatus. The invention is furthermore distinguished by a system having the high-voltage apparatus and the external reproduction apparatus.

The high-voltage apparatus has at least one high-voltage component. The high-voltage apparatus has at least one current sensor that is associated with a respective high-voltage component. The high-voltage apparatus has at least one transmission apparatus that has at least one respective associated current sensor. The at least one transmission apparatus is designed to take a measurement signal from the at least one respective current sensor as a basis for providing an information signal by way of a wireless radio link. The information signal has a piece of information about whether or not a potential threat is posed by the respective high-voltage component. The at least one transmission apparatus is designed to provide the information signal by way of a wireless radio link.

By way of example, for each current sensor, the high-voltage apparatus has a transmission apparatus that has only one respective associated current sensor.

Examples of such high-voltage components are components that are provided for producing, transmitting and/or consuming electric power at a high electrical voltage. A high electrical voltage of this kind is at least 300 V for example. A high-voltage component of this kind is an electrical energy store, an electric drive machine, a cable, a plug and/or a connection in the high-voltage apparatus, for example.

The current sensor is installed in a manner integrated in a plug and/or in what is known as a black box and/or in a cable, for example.

An example of a high-voltage apparatus of this kind is a vehicle, such as a hybrid or electric vehicle, a test bench, a photovoltaic installation, a power supply installation, a rail vehicle installation and/or a rail vehicle.

A high-voltage apparatus of this kind allows the information signal to be provided for the external reproduction apparatus, which information signal has a piece of information about whether or not a potential threat is posed by the respective high-voltage component. By way of example, the information includes whether or not the respective at least one current sensor measures an electric current and/or what the level of the measured electric current is and/or whether the respective at least one current sensor has a fault. This means that it is possible for an emergency worker, for example, to establish whether a threat is posed by the high-voltage apparatus and whether or not he or she can approach the high-voltage apparatus without danger in a simple manner and without touching.

According to a further advantageous embodiment, the information signal has a piece of position information that is representative of a position of the at least one respective current sensor in the high-voltage apparatus.

This means that it is a very simple matter for the emergency worker, for example, to establish where the respective current sensor is positioned in the high-voltage apparatus. It is therefore possible to establish what location in the high-voltage apparatus may pose a threat.

According to a further advantageous embodiment, the high-voltage apparatus is a vehicle.

Specifically in the case of a vehicle, such as a hybrid vehicle and/or an electric vehicle, it is important for the emergency worker to know whether or not he or she can approach the vehicle in order to be able to initiate rescue measures quickly and safely.

According to a further advantageous embodiment, the information signal has a vehicle identifier that is representative of the vehicle type of the vehicle.

Specifically in the case of modern vehicles, it is often not immediately evident from the outside whether an electric vehicle and/or a hybrid vehicle is involved. Transmission of the vehicle type allows the rescue worker, for example, to tell whether the vehicle is an electric vehicle and/or a hybrid vehicle.

The external reproduction apparatus has a radio reception unit that is designed to receive the information signal that has been provided by the high-voltage apparatus or by an advantageous embodiment of the high-voltage apparatus. The external reproduction apparatus is designed to react to reception of the information signal by displaying a respective two-colored set of traffic lights that is associated with the at least one respective current sensor. A first traffic light color is representative of no threat being posed by the respective high-voltage component. A second traffic light color is representative of a threat being posed by the respective high-voltage component.

The external reproduction apparatus has a display, for example, such as a screen, for reproduction. The external reproduction apparatus is particularly a portable apparatus, such as a smart phone and/or a tablet PC.

The respective two-colored set of traffic lights provides a simple way of using the external reproduction apparatus to reproduce whether or not the respective high-voltage component poses a threat. By way of example, the first traffic light color may thus be green and the second traffic light color may be red.

According to one advantageous embodiment, the information signal has a piece of position information that is representative of a position of the at least one respective current sensor in the high-voltage apparatus. The external reproduction apparatus is designed to display the respective two-colored set of traffic lights at the position of the at least one respective current sensor.

This means that the position of the at least one respective current sensor can be displayed on the external reproduction apparatus in a simple manner. By way of example, it is thus a simple matter for the rescue worker to establish where the respective current sensor is positioned in the high-voltage apparatus. Hence, it is possible to establish what location in the high-voltage apparatus may pose a threat.

According to a further advantageous embodiment, the high-voltage apparatus is a vehicle. The information signal has a vehicle identifier that is representative of a vehicle type of the vehicle. The external reproduction apparatus is designed to display the respective two-colored set of traffic lights at the position of the at least one respective current sensor on a vehicle depiction that matches the vehicle type of the vehicle.

This means that the external reproduction apparatus can be used to display simply and clearly where the respective at least one current sensor and the respective high-voltage component are arranged in the vehicle.

Other objects, advantages and novel features of the present invention will become apparent from the following detailed description of one or more preferred embodiments when considered in conjunction with the accompanying drawings.

DETAILED DESCRIPTION OF THE DRAWINGS

Elements having the same design or function are denoted by the same reference symbols throughout the figures.

Figure 1:
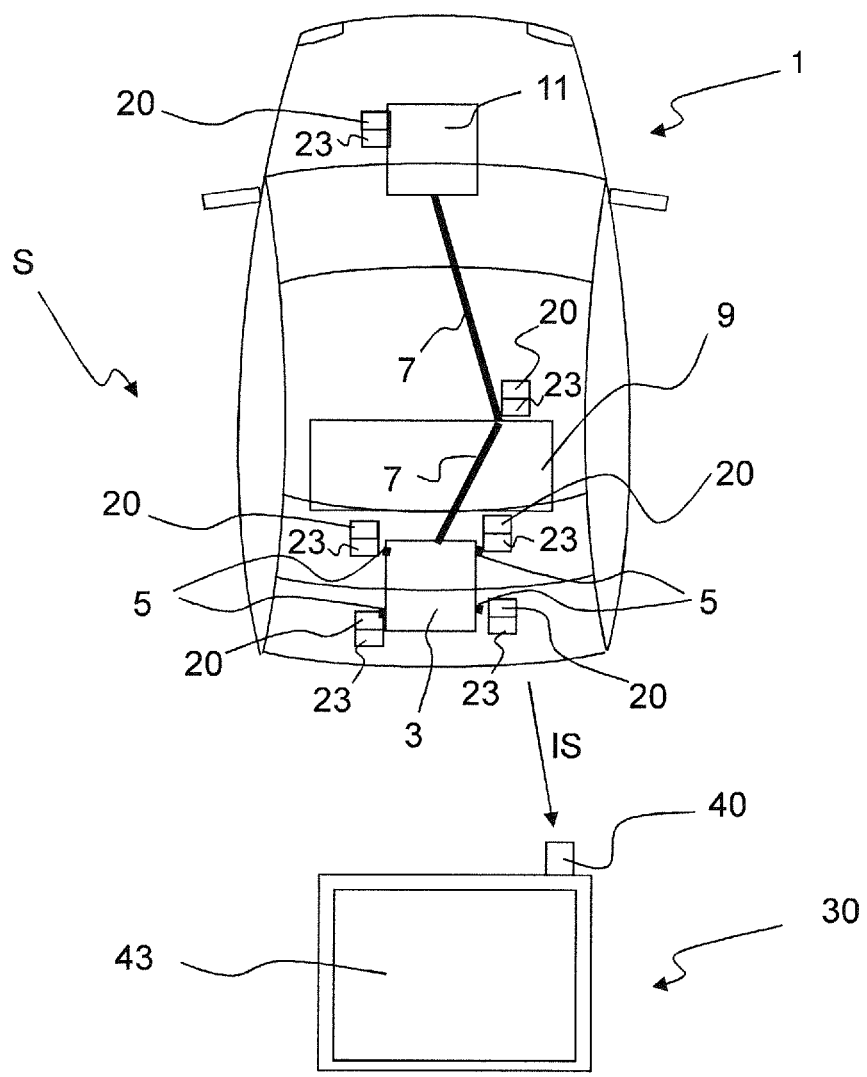
FIG. 1 is a highly schematic diagram of a system according to an embodiment of the invention.

FIG. 1 shows a system S having a vehicle 1 as an example of a high-voltage apparatus. The vehicle 1 is particularly an electric vehicle and/or a hybrid vehicle, that is to say a vehicle 1 having just an electric drive and/or having a combination of an electric drive and an internal combustion engine, for example, as a drive.

Alternatively, the high-voltage apparatus may also be a test bench, a photovoltaic installation, a power supply installation, a rail vehicle installation, a rail vehicle and/or a B2U system. A B2U system is a system for continued use of previously used high-voltage vehicle batteries as an electrical energy store for stationary applications.

The high-voltage apparatus has at least one high-voltage component. Examples of such high-voltage components are an electric drive machine 3, a connection 5 on the electric drive machine 3, a cable 7, a high-voltage battery 9 and/or a vehicle component 11 to which a high voltage can be applied. A high voltage in this context is a voltage of at least 300 V, for example. The vehicle component 11 is a flow heater and/or a component of an electric drive unit and/or an electric motor, for example.

The high-voltage apparatus has at least one current sensor 20 that is associated with the respective high-voltage component. An example of such a current sensor 20 is a flow rate current sensor. Such a current sensor 20 is installed in a manner integrated in a plug or in a black box and/or in the cable 7, for example.

By way of example, a current sensor 20 is thus installed on each connection 5 on the electric drive machine 3. Alternatively or additionally, a current sensor 20 is installed on each cable 7, for example. Alternatively or additionally, a plurality of current sensors 20 are installed on each cable 7, for example.

The high-voltage apparatus has at least one transmission apparatus 23 that has at least one respective associated current sensor 20. In particular for each current sensor 20, the high-voltage apparatus has a transmission apparatus 23 that has only one respective associated current sensor 20.

The at least one transmission apparatus 23 is designed to take a measurement signal from the at least one respective current sensor 20 as a basis for providing an information signal IS by way of a wireless radio link, which information signal has a piece of information about whether or not a potential threat is posed by the respective high-voltage component, for the purpose of reproducing the piece of information on an external reproduction apparatus 30 of the system S.

The external reproduction apparatus 30 is a portable apparatus, for example, such as a smart phone and/or a tablet PC.

For this purpose, the transmission apparatus 23 has a computation unit, a program and data memory and at least a first and a second interface, for example. The computation unit and/or the program and data memory may be produced in one unit or else in a manner distributed over a plurality of units. By way of example, the first interface is designed to receive the measurement signal from the at least one respective current sensor 20. By way of example, the second interface is designed to provide the information signal IS by way of the wireless radio link. The wireless radio link is a Bluetooth link, for example. Alternatively, the wireless radio link is a link based on a mobile radio standard, for example, such as GSM, UMTS or LTE.

If the measurement signal from the respective at least one current sensor 20 indicates a fault in the respective at least one current sensor 20, for example, then this can suggest a threat. If, by way of example, one current sensor 20 of a high-voltage component uses the measurement signal to report that an electric current is flowing and a further current sensor 20 of the same high-voltage component reports that no current is flowing, then it can be inferred that a threat is posed by the high-voltage component, for example because there is a short between the two current sensors 20. If a high-voltage component has only one current sensor 20, for example, then, by way of example, if the latter reports that no current is flowing, a threat may also be assumed.

If all the current sensors 20 of the high-voltage apparatus report that a normal current is flowing, then it can be inferred that no threat is posed by the high-voltage apparatus. Alternatively or additionally, it can be inferred that no threat is posed by the high-voltage apparatus if all the current sensors 20 of the high-voltage apparatus report that no current is flowing.

By way of example, the information signal IS has a piece of position information that is representative of a position of the at least one respective current sensor 20 in the high-voltage apparatus.

By way of example, the information signal IS has a vehicle identifier that is representative of a vehicle type of the vehicle 1.

The information signal IS is provided for the external reproduction apparatus 30. For this purpose, the external reproduction apparatus 30 has particularly a radio reception unit 40 that is designed to receive the information signal IS.

Figure 2:
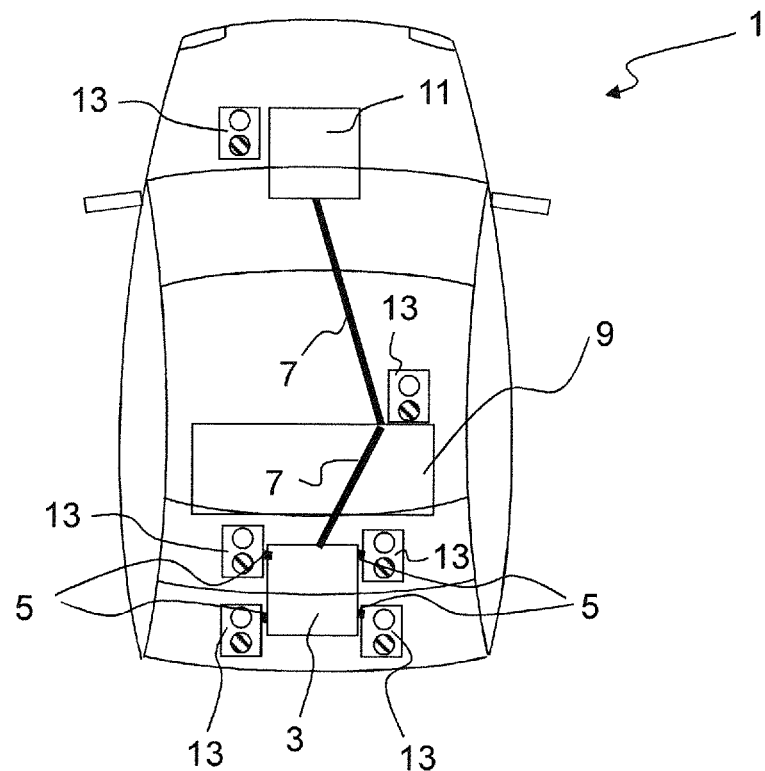
FIG. 2 is a highly schematic diagram depicting a vehicle.

The reproduction apparatus 30 is designed to react to reception of the information signal IS by using a display 43 of the external reproduction apparatus 30, for example, to display a respective two-colored set of traffic lights 13 that is associated with the at least one respective current sensor 20 (see FIG. 2). A first traffic light color is representative of no threat being posed by the respective high-voltage component. A second traffic light color is representative of a threat being posed by the respective high-voltage component. The first traffic light color is green, for example. The second traffic light color is red, for example.

For this purpose, the external reproduction apparatus 30 additionally has a computation unit, a program and data memory, at least one interface and the radio reception unit 40, for example. The computation unit and/or the program and data memory and/or the radio reception unit 40 may be produced in one unit or else in a manner distributed over a plurality of units. By way of example, the radio reception unit 40 is designed to receive the information signal IS. By way of example, the interface is designed to communicate with the display 43.

By way of example, the respective two-colored set of traffic lights 13 is displayed at the position of the at least one respective current sensor 20 if the information signal IS has the piece of position information that is representative of the position of the at least one respective current sensor 20 in the high-voltage apparatus.

Figure 3:
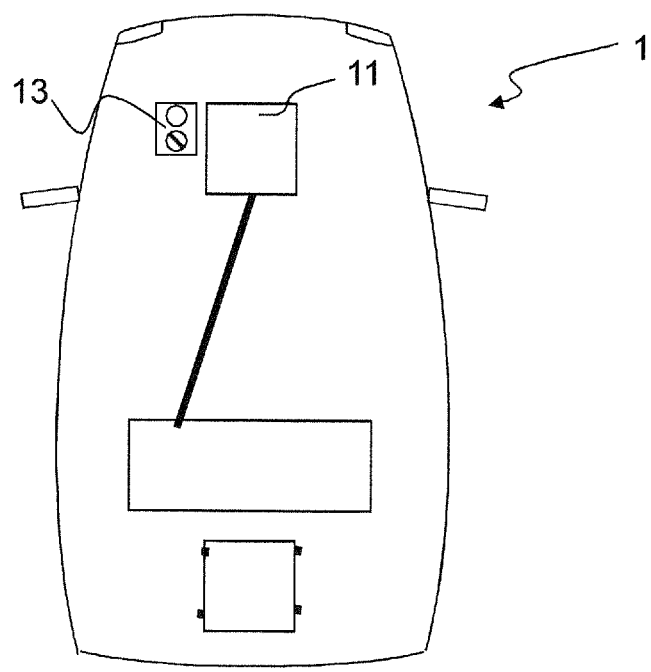
FIG. 3 is a highly schematic diagram of a further depiction of the vehicle.

Alternatively or additionally, the respective two-colored set of traffic lights 13 is displayed on a vehicle depiction that matches the vehicle type of the vehicle 1 if the information signal IS has the vehicle identifier that is representative of the vehicle type of the vehicle 1. For this purpose, the vehicle 1 is displayed by a view from above (see FIG. 2) and displayed by a view from below (see FIG. 3), for example.

If the information signal IS includes the vehicle identifier, then the external reproduction apparatus 30 can additionally tell whether individual transmission apparatuses 23 of the vehicle 1 do not send an information signal IS, for example, since, by way of example, the vehicle identifier can be used to ascertain how many transmission apparatuses 23 are arranged in the respective vehicle 1. If individual transmission apparatuses 23 of the vehicle 1 do not send an information signal IS, then this can also be displayed as a threat, for example by virtue of the respective two-colored sets of traffic lights 13 that are associated with current sensors 20 that are associated with these individual transmission apparatuses 23 displaying the second traffic light color.

Hence, the high-voltage apparatus and the external reproduction apparatus 30 can be used to help an emergency worker, for example, to be able to establish whether a threat is posed by the high-voltage apparatus and whether or not he or she can approach the high-voltage apparatus in a simple manner and without touching.

LIST OF REFERENCE SYMBOLS

1 Vehicle
3 Electric drive machine
IS Information signal
S System

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A high-voltage apparatus, comprising:
   a plurality of high-voltage components, each high-voltage component having an associated current sensor and transmission apparatus,
   wherein the transmission apparatus receives a measurement signal from the associated current sensor and based thereon transmits an information signal, which includes threat data indicating a threat status of an associated high-voltage component and position data indicating a position of the associated current sensor, via a wireless radio link to an external reproduction apparatus, so as to cause the external reproduction apparatus to display thereon (i) the position of the associated current sensor within the high-voltage apparatus, and (ii) the threat status of the associated high-voltage component.

2. The high-voltage apparatus according to claim 1, wherein the high-voltage apparatus is a vehicle.

3. The high-voltage apparatus according to claim 2, wherein the information signal contains a vehicle identifier representative of a vehicle type of the vehicle.

4. An external reproduction apparatus, comprising:
   a radio reception unit configured to receive an information signal provided by a high-voltage apparatus having a plurality of high-voltage components, each high-voltage component having an associated current sensor, the information signal including threat data indicating a threat status of an associated high-voltage component and position data indicating a position of the associated current sensor; and
   a display configured to display, based on the information signal, (i) the position of the associated current sensor within the high-voltage apparatus, and (ii) the threat status of the associated high-voltage component as a respective two-colored set of traffic lights, wherein a first traffic light color represents no threat being posed by the associated high-voltage component and a second traffic light color represents a threat being posed by the associated high-voltage component.

5. The external reproduction apparatus according to claim 4, wherein
   wherein the display is further configured to display the respective two-colored set of traffic lights so as to indicate the position of the current sensor within the high-voltage apparatus.

6. The external reproduction apparatus according to claim 5, wherein
   the high-voltage apparatus is a vehicle,
   the information signal contains a vehicle identifier representative of a vehicle type of the vehicle,
   the external reproduction apparatus is configured to display the respective two-color set of traffic lights at the position indicative of the position of the respective current sensor on a vehicle depiction matching the vehicle type of the vehicle.

7. A system, comprising:

a high-voltage apparatus, the high-voltage apparatus comprising: a plurality of high-voltage components, each high-voltage component having an associated current sensor and transmission apparatus, wherein the transmission apparatus receives a measurement signal from the associated current sensor and based thereon transmits an information signal, which includes threat data indicating a threat status of an associated high-voltage component and position data indicating a position of the associated current sensor, via a wireless communication link;

an external reproduction apparatus, the external reproduction apparatus comprising:
- a wireless reception unit configured to receive the information signal provided by the high-voltage apparatus;
- a display configured to display, based on the received information signal, (i) the position of the associated current sensor within the high-voltage apparatus, and (ii) the threat status of the associated high-voltage component as a respective two-colored set of traffic lights, wherein a first traffic light color represents no threat being posed by the associated high-voltage component and a second traffic light color represents a threat being posed by the associated high-voltage component.

* * * * *